United States Patent
Strmiska et al.

(10) Patent No.: US 11,841,750 B2
(45) Date of Patent: Dec. 12, 2023

(54) INTERCHANGEABLE LABELING STRIP IN CHASSIS HEM

(71) Applicant: Dell Products L.P., Round Rock, TX (US)

(72) Inventors: Bernard D. Strmiska, Round Rock, TX (US); Eduardo Escamilla, Round Rock, TX (US); Matthew B. Gilbert, Austin, TX (US); Richard Crisp, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 220 days.

(21) Appl. No.: 17/224,932

(22) Filed: Apr. 7, 2021

(65) Prior Publication Data

US 2022/0326742 A1   Oct. 13, 2022

(51) Int. Cl.
G06F 1/18        (2006.01)
H05K 7/14        (2006.01)

(52) U.S. Cl.
CPC ........... G06F 1/181 (2013.01); H05K 7/1401 (2013.01)

(58) Field of Classification Search
CPC .............................. G06F 1/181; H05K 7/1401
See application file for complete search history.

(56) References Cited

U.S. PATENT DOCUMENTS

| | | | | |
|---|---|---|---|---|
| 4,277,120 A * | 7/1981 | Drake | ................. | H05K 7/1425 361/756 |
| 5,822,182 A * | 10/1998 | Scholder | ................. | G06F 1/183 361/818 |
| 6,280,238 B1 * | 8/2001 | Baker | ................. | H01R 9/2475 439/491 |
| 2020/0077165 A1 * | 3/2020 | Wilcox | ................. | H04Q 1/02 |

FOREIGN PATENT DOCUMENTS

| | | | | |
|---|---|---|---|---|
| DE | 4311137 C2 * | 4/2001 | ............ | H02G 3/121 |
| EP | 0910234 A2 * | 4/1999 | | |

* cited by examiner

*Primary Examiner* — Matthew W Ing
(74) *Attorney, Agent, or Firm* — Jackson Walker L.L.P

(57) ABSTRACT

A chassis for housing information handling resources of an information handling system may include an enclosure, a plurality of bays formed within the enclosure, each bay of the plurality of bays configured to receive a corresponding modular information handling resource, and a hem comprising a ledge extending from the enclosure and running proximate to at least a portion of the plurality of bays. The hem may have formed therein a recess sized and shaped in accordance with physical dimensions of an interchangeable labeling strip and a plurality of retention features, each retention feature configured to receive a corresponding engagement feature of the interchangeable labeling strip, in order to retain the interchangeable labeling strip within the recess.

13 Claims, 2 Drawing Sheets

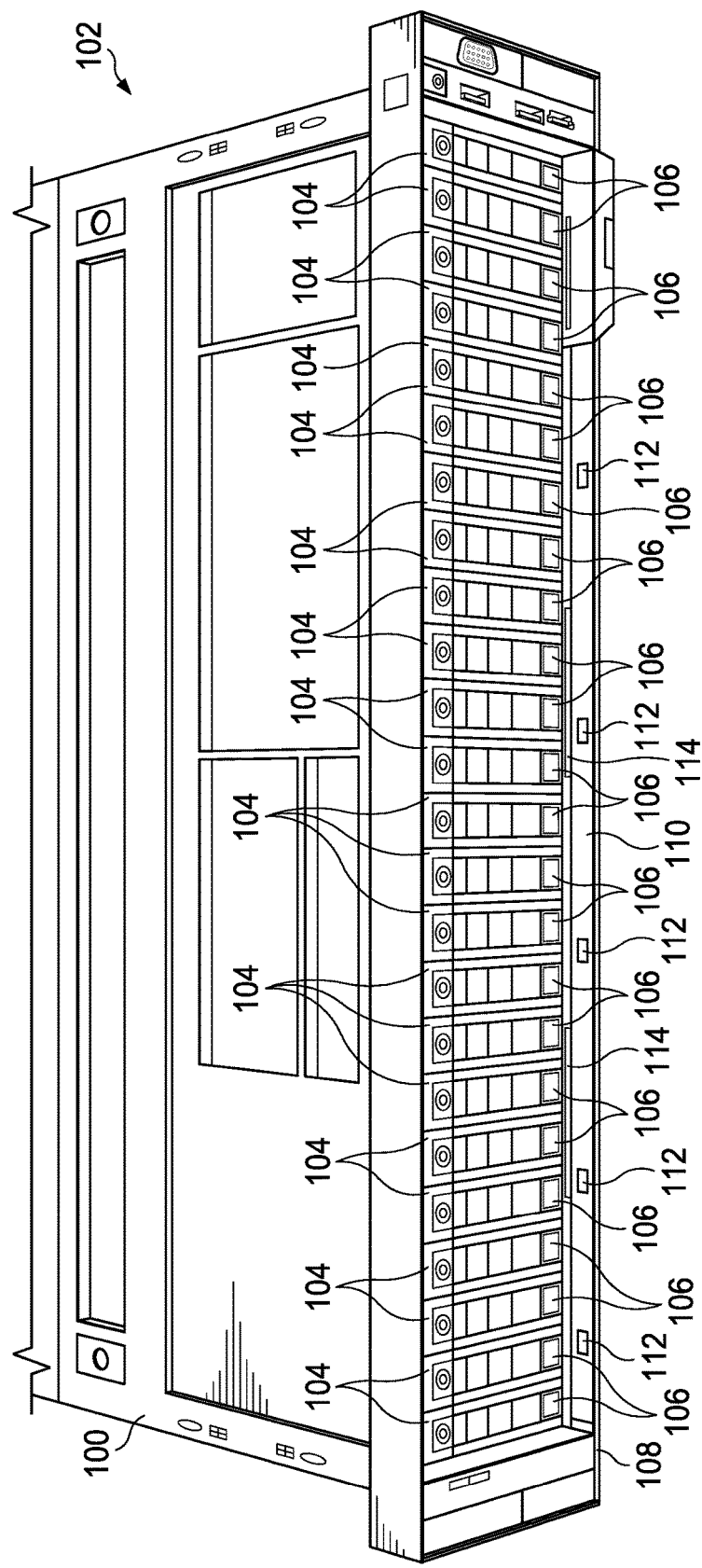
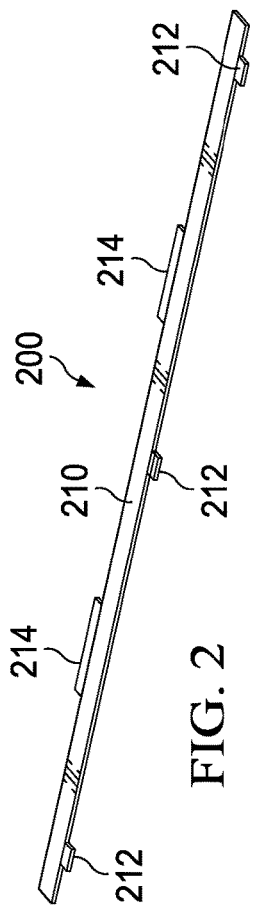
FIG. 1
FIG. 2

# INTERCHANGEABLE LABELING STRIP IN CHASSIS HEM

TECHNICAL FIELD

The present disclosure relates in general to information handling systems, and more particularly to systems and methods for providing an interchangeable labeling strip in a chassis hem of an information handling system, for providing configuration information to a user.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system data centers often include tens to hundreds of rack enclosures—each containing multiple servers, storage devices, and network switches. Each particular information handling system chassis in the data center may have a different configuration for receiving modular information handling resources. Configuration options for an information handling system may include selection among options for the types of bays (and associated hardware) the information handling system may have for receiving modular information handling resources, such as modular disk drives, modular graphics processing units, modular logic devices, or other modular information handling resources. Accordingly, when a user (e.g., administrator or technician) is servicing an information handling system, it may be desirable for the exterior of the information handling system proximate to such bays to include information regarding the type of information handling resource each bay may receive.

For example, in existing approaches, silkscreen printing is often used to directly print an enumeration of bays on a hem of an information handling system chassis. However, such labeling cannot be easily changed after applied, meaning a user may need to apply a cover up decal if a non-standard bay configuration is used.

SUMMARY

In accordance with the teachings of the present disclosure, the disadvantages and problems associated with existing approaches to management and administration of an information handling system chassis may be reduced or eliminated.

In accordance with embodiments of the present disclosure, a chassis for housing information handling resources of an information handling system may include an enclosure, a plurality of bays formed within the enclosure, each bay of the plurality of bays configured to receive a corresponding modular information handling resource, and a hem comprising a ledge extending from the enclosure and running proximate to at least a portion of the plurality of bays. The hem may have formed therein a recess sized and shaped in accordance with physical dimensions of an interchangeable labeling strip and a plurality of retention features, each retention feature configured to receive a corresponding engagement feature of the interchangeable labeling strip, in order to retain the interchangeable labeling strip within the recess.

In accordance with these and other embodiments of the present disclosure, an interchangeable labeling strip may include a body sized and shaped in accordance with a recess formed in a hem of an information handling system chassis and a plurality of engagement features extending from the body, each engagement feature configured to engage with a corresponding retention feature formed in the hem, in order to retain the interchangeable labeling strip within the recess.

In accordance with these and other embodiments of the present disclosure, a method may include inserting a body of an interchangeable labeling strip into a hem of an information handling system chassis, wherein the hem comprises a ledge extending from an enclosure of the information handling system chassis and running proximate to at least a portion of a plurality of bays formed in the enclosure. The hem may have formed therein a recess sized and shaped in accordance with physical dimensions of the body of the interchangeable labeling strip and a plurality of retention features. The method may further include engaging each of a plurality of engagement features with a corresponding retention feature formed in the hem in order to retain the interchangeable labeling strip within the recess, wherein each of the plurality of engagement features extends from the body.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 illustrates a perspective view of an exterior of an information handling system, in accordance with embodiments of the present disclosure;

FIG. 2 illustrates a perspective view of an interchangeable labeling strip, in accordance with embodiments of the present disclosure.

DETAILED DESCRIPTION

Figure 3:
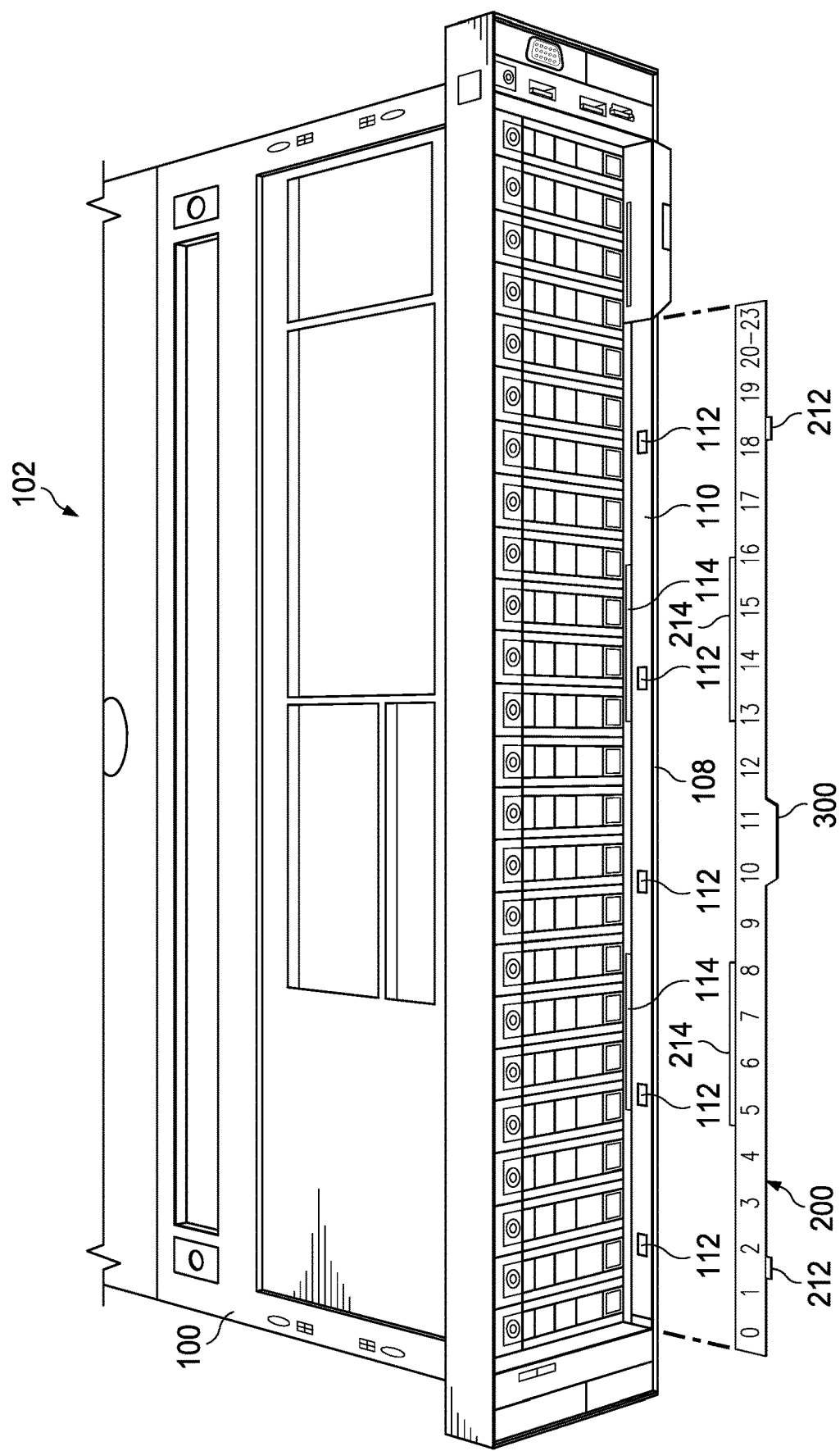
FIG. 3 illustrates a perspective view of the information handling system of FIG. 1 and the interchangeable labeling strip of FIG. 2 depicting how the interchangeable labeling strip engages with a chassis hem of the information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a perspective view of an exterior of an information handling system 102, in accordance with embodiments of the present disclosure. As shown in FIG. 1, information handling system 102 may include a chassis 100. Chassis 100 may be an enclosure that serves as a container for various information resources of information handling system 102, and may be constructed from steel, aluminum, plastic, and/or any other suitable material. Although the term "chassis" is used, chassis 100 may also be referred to as a case, enclosure, and/or housing.

As shown in FIG. 1, chassis 100 may include a plurality of bays 104 for housing modular information handling resources 106, allowing a user of information handling system 102 to readily insert or remove (e.g., "hot swap") modular information handling resources 106 that are compatible with one or more of bays 104.

As shown in FIG. 1, chassis 100 may include a hem 108, which may comprise a small shelf or ledge extending from chassis 100 along a bottom edge of chassis 100 below and proximate to at least a portion of bays 104. As also shown in FIG. 1, hem 108 may include a recess 110 formed therein, sized and shaped to receive, one at a time, a plurality of interchangeable labeling strips, such as interchangeable labeling strip 200 shown in FIG. 2, described below. Further, hem 108 may also include retention features 112 and 114 formed therein, wherein each retention feature 112 and 114 is configured to retain a corresponding engagement feature (e.g., engagement features 212 and 214, shown in FIG. 2, described below) of an interchangeable labeling strip inserted into recess 110, thus causing such interchangeable labeling strip to be mechanically retained (e.g., by "snapping in") within recess 110.

FIG. 2 illustrates a perspective view of an interchangeable labeling strip 200, in accordance with embodiments of the present disclosure. As shown in FIG. 2, interchangeable labeling strip 200 may include an elongated body 210, shaped to be received into recess 110, such that interchangeable labeling strip 200 may be seated flush within recess 110. Further as shown in FIG. 2, interchangeable labeling strip 200 may have a plurality of engagement features 212 and 214 extending from body 210. Each engagement feature 212 may be configured (e.g., sized and shaped) to engage with a corresponding retention feature 112 of hem 108. Similarly, each engagement feature 214 may be configured (e.g., sized and shaped) to engage with a corresponding retention feature 114 of hem 108. Accordingly, when interchangeable labeling strip 200 is seated within recess 108, engagement features 212 may engage with retention features 112 and engagement features 214 may engage with retention features 114, such that interchangeable labeling strip 200 "snaps" into place on hem 108, as is depicted in FIG. 2. In addition, a user may remove interchangeable labeling strip 200 from hem 108 by applying necessary force to disengage engagement features 212 from retention features 112 and disengage engagement features 214 from retention features 114. For example, as shown in FIG. 3, interchangeable labeling strip 200 may also include a tab 300 extending from body 210, allowing a user to pull on tab 300 to disengage interchangeable labeling strip 200 from hem 108.

Interchangeable labeling strip 200 may be formed from plastic, or any other suitable material.

As also shown in FIG. 3, interchangeable labeling strip 200 may include one or more labels (e.g., numbers 0 through 23 shown on interchangeable labeling strip 200, label "SAS/ SATA" indicating type of information handling resources that may be received in bays 104, etc.).

Accordingly, the systems and methods described above provide for a seamless, flush snap-in labeling solution, in which an interchangeable snap-in part (e.g., interchangeable labeling strip 200) that can be swapped out after point of sale of information handling system 102. Thus, the systems and methods described above provide for a single removable part that can have any suitable arrangement of labels in order to provide labels to cover numerous configurations for information handling system 102. The systems and methods described above may also enable a common chassis to be used for many different configurations of information handling system 102, with an interchangeable labeling strip 200 applied to indicate a particular configuration. In some embodiments, an interchangeable labeling strip 200 may overlap and cover up default labels printed (e.g., silkscreen printed) within recess 110. In other embodiments, recess 110 itself may be free of printed labels.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A chassis for housing information handling resources of an information handling system, the chassis comprising:
   an enclosure;
   a plurality of bays formed within the enclosure, each bay of the plurality of bays configured to receive a corresponding modular information handling resource; and
   a hem comprising a ledge extending horizontally from a bottom edge of the enclosure and running proximate to at least a portion of the plurality of bays, the hem having formed therein:
      a recess sized and shaped in accordance with physical dimensions of an interchangeable labeling strip; and
      a plurality of retention features, each retention feature configured to receive a corresponding engagement feature of the interchangeable labeling strip, in order to retain the interchangeable labeling strip within the recess.

2. The chassis of claim 1, wherein the recess is sized and shaped such that the interchangeable labeling strip is seated flush within the recess when the interchangeable labeling strip is received in the recess.

3. The chassis of claim 1, wherein the interchangeable labeling strip comprises labels comprising information regarding a configuration of the plurality of bays.

4. An interchangeable labeling strip, comprising:
   a body sized and shaped in accordance with a recess formed in a hem of an information handling system chassis; and
   a plurality of engagement features extending from the body, each engagement feature configured to engage with a corresponding retention feature formed in the hem, in order to retain the interchangeable labeling strip within the recess, wherein the plurality of engagement features include a first plurality of engagement features extending from a first edge of the body and a second plurality of engagement features extending from a second edge of the body.

5. The interchangeable labeling strip of claim 4, wherein the interchangeable labeling strip is formed from plastic.

6. The interchangeable labeling strip of claim 4, further comprising a tab extending therefrom to allow a user to apply a force to the tab to remove the interchangeable labeling strip from the recess.

7. The interchangeable labeling strip of claim 4, wherein the body is sized and shaped such that the interchangeable labeling strip is seated flush within the recess when the interchangeable labeling strip is received in the recess.

8. The interchangeable labeling strip of claim 4, wherein the interchangeable labeling strip comprises labels comprising information regarding a configuration of a plurality of bays proximate to the hem.

9. A method comprising:
- inserting a body of an interchangeable labeling strip into a hem of an information handling system chassis, wherein the hem comprises a ledge extending horizontally from a bottom edge of an enclosure of the information handling system chassis and running proximate to at least a portion of a plurality of bays formed in the enclosure, the hem having formed therein:
  - a recess sized and shaped in accordance with physical dimensions of the body of the interchangeable labeling strip; and
  - a plurality of retention features; and
- engaging each of a plurality of engagement features with a corresponding retention feature formed in the hem in order to retain the interchangeable labeling strip within the recess, wherein each of the plurality of engagement features extends from the body.

10. The method of claim 9, wherein the interchangeable labeling strip is formed from plastic.

11. The method of claim 9, further comprising applying a force to a tab extending from the body in order to remove the interchangeable labeling strip from the recess.

12. The method of claim 9, wherein the recess is sized and shaped such that the interchangeable labeling strip is seated flush within the recess when the interchangeable labeling strip is received in the recess.

13. The method of claim 9, wherein the interchangeable labeling strip comprises labels comprising information regarding a configuration of a plurality of bays proximate to the hem.

* * * * *